(12) United States Patent
Tamura

(10) Patent No.: US 6,745,355 B1
(45) Date of Patent: Jun. 1, 2004

(54) SEMICONDUCTOR INTEGRATED CIRCUIT

(75) Inventor: Junichi Tamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/283,973

(22) Filed: Apr. 1, 1999

(30) Foreign Application Priority Data

Jul. 13, 1998 (JP) .......................................... 10-197822

(51) Int. Cl.[7] .............................................. G01R 31/28
(52) U.S. Cl. ........................ 714/726; 714/727; 714/729
(58) Field of Search ...................... 395/500.49; 714/726, 714/727, 28, 724, 729, 733

(56) References Cited

U.S. PATENT DOCUMENTS

| 5,056,013 A | * | 10/1991 | Yamamoto ............. 395/500.49 |
| 5,153,882 A | * | 10/1992 | Lyon et al. .................. 714/726 |
| 5,355,369 A | * | 10/1994 | Greenberger et al. ....... 714/727 |
| 5,386,423 A | * | 1/1995 | Koo et al. .................. 714/726 |
| 5,495,486 A | * | 2/1996 | Gheewala .................... 714/724 |
| 5,805,792 A | * | 9/1998 | Swoboda et al. ............. 714/28 |
| 5,862,152 A | * | 1/1999 | Handly et al. .............. 714/727 |

* cited by examiner

*Primary Examiner*—David Ton
(74) *Attorney, Agent, or Firm*—Volentine Francos, PLLC

(57) ABSTRACT

A semiconductor integrated circuit having the function of the logical verification includes a plurality of units to be logically verified, which independently operate in the ordinary operation and include scan-path register respectively, which are operable as a shift register when connected in sequence in the logical verification operation; an instruction register scan input terminal to which an instruction for logical verification is externally inputted; an instruction register in which the instruction for logical verification is stored; an instruction decoder which decodes the instruction from the instruction register and executes the instruction for logical verification against said units; and a unit scan output terminal for externally outputting the processing result of the units. The circuit scale can be reduced by providing each unit with a scan-path register.

8 Claims, 10 Drawing Sheets

SEMICONDUCTOR INTEGRATED CIRCUIT

BACKGROUND OF THE INVENTION

The present invention relates to a semiconductor integrated circuit, for instance a digital signal processor (referred to as "DSP" hereinafter), a microprocessor and so forth, more particularly, the invention relates to a semiconductor integrated circuit which can be used for the purpose of logical verification of the internal parts of the circuit and the data verification of the internal register.

Generally, the semiconductor integrated circuit includes a plurality of processing circuits for executing necessary processes. The term 'processing circuit' herein refers to a combination circuit which is constructed with logical circuits, for instance as an AND circuit, an OR circuit and so forth. The logic level of the output signal from such combination circuit is determined to be a predetermined logical level corresponding to the logical level of the input signal supplied thereto. However, should such combination circuit have a certain defect and/or should the change with the passage of time relating to its performance be not in an allowable range, the output signal comes to have a logical level which is neither the desired logical level nor responds to the logical level of the input signal. Thus, it is necessary to verify whether the semiconductor integrated circuit including such combination circuit normally operates or not, and execution of the logical verification increases its importance.

For the purpose of carrying out this logical verification, the semiconductor integrated circuit includes a plurality of scan-path registers. Each scan-path register is constituted with a data maintaining circuit which receives the input signal to the combination circuit or the output circuit therefrom. In case of ordinarily processing the signal which is externally inputted to the semiconductor integrated circuit (referred to as "ordinary processing" hereinafter), the scan-path register operates to transfer its received input signal to the combination circuit or to output the signal outputted by the combination circuit to a certain circuit in the next stage. This circuit in the next stage indicates such a circuit that receives the output signal from the combination circuit and applies a desired processing thereto. In time of executing the logical verification over the combination circuit (referred to as "logical verification time" hereinafter), the scan-path registers are connected in sequence with each other, thereby constituting a shift register as a whole.

Regarding to the logical verification of the semiconductor integrate circuit using the scan-path registers, there has been published by Oki Denki Kogyo K.K. an article entitled "Scan-path Register." In the following, an example of a data system connection relating to the logical verification operation will be explained by way of the semiconductor integrated circuit using the scan-path register as disclosed in the above article, referring to FIG. 10 of the accompanying drawings.

Referring to FIG. 10, there is shown a diagram of a conventional semiconductor integrated circuit 800 which includes three combination circuits 811-1 through 811-3 to be logically verified. The semiconductor integrated circuit 800 also includes a plurality of signal terminals for exchanging the signal with external portions, to be more concrete, an input terminal MD for a mode setting signal, a first clock input terminal CL1, a second clock input terminal CL2, a data input terminal 880 for the Scan-path, and a data output terminal 881 for the Scan-path.

The input terminal MD for the mode setting signal receives the mode setting signal which is used for switching the operation of the scan-path register from the serial operation to the parallel operation or vice versa, both operations being described later. The first clock input terminal CL1 receives the first clock signal which is used under the first operating condition, that is, under the ordinary operating condition. The second clock input terminal CL2 receives the second clock signal under the second operating condition, namely in the logical verification time. The data input terminal 880 for the scan-path receives a data signal SIN which is used for the logical verification in the logical verification time. The data output terminal 881 for the scan-path outputs the data signal SOUT which is obtained as a result of the logical verification.

The semiconductor integrated circuit 800 further includes scan-path registers 810-1 through 810-n and 820-1 through 820-n (n: positive integer) as the data maintaining circuit, and a control signal generating circuit 840.

The scan-path registers 810-K (or 820-K) (K: positive integer but $1 \leq K \leq n$) include a clock input terminal CK, a first data input terminal D, a second data input terminal SI, a first control signal input terminal K1, a second control signal input terminal K2, and an output terminal Q.

The control signal generating circuit 840 is connected with the mode setting signal input terminal MD, the first clock input terminal CL1, and the second clock input terminal CL2, respectively. This control signal generating circuit 840 generates a plurality of control signals C/!C, PC/!PC, and SC/!SC. The control signal C/!C represents either one or both of a control signal C and an inverted control signal !C having a logical level complementary to that of the control signal C.

The control signal C/!C is inputted to the clock input terminal CK of the scan-path register 810-K (or 820-K). The control signal PC/!PC is inputted to the first control signal input terminal K1 of the scan-path register 810-K (or 820-K). The control signal SC/!SC is inputted to the second control signal input terminal K2 of the scan-path register 810-K (or 820-K).

The output signal from the combination circuit 811-1 is inputted to the first data input terminal D of the scan-path register 810-K. The output signal from the combination circuit 811-2 is inputted to the first data input terminal D of the scan-path register 820-K. The second data input terminal SI of the scan-path register 810-K is connected with the output terminal Q of the scan-path register 810-(K−1). However, in case of K=1, the second data input terminal SI is connected to the data input terminal 880 for the scan-path.

The second data input terminal SI of the scan-path register 820-K is connected with the output terminal Q of the scan-path register 820-(K−1). However, in case of K=1, the second data input terminal SI is connected with the output terminal Q of the scan-path register 810-n. The output terminal Q of the scan-path register 810-K is also connected with the combination circuit 811-2 while the output terminal Q of the scan-path register 820-K is also connected with the combination circuit 811-3. In case of K=n, however, the output terminal Q is also connected with the output terminal 881 for the Scan-path.

It will now be explained in the following how to carry out the logical verification against the combination circuit by means of the scan-path register.

(1) Test Serial Input Operation

In this operation, the data SIN (referred to as "test vector" hereinafter) for logical verification is serially inputted to the data input terminal 880 for the Scan-path, thereby storing the data in all the scan-path registers 810-1 through 810-n and 820-1 through 820-n with the help of the shift operation. This operation is carried out in response the second clock signal CL2.

(2) Test Parallel Operation

In this operation, the test vector SIN stored in the scan-path registers, which are disposed on the input side of the combination circuit to be logically verified, is inputted to the above combination circuit, of which the output is then given to and stored in the scan-path registers which are disposed on the output side of the above combination circuit. This operation is performed in response to the second clock signal CL2. To be more concrete, referring to FIG. 10, assuming now that the combination circuit is the circuit 811-2, the scan-path registers on the input side are those which are denoted with reference numerals 810-1 through 810-n while the scan-path registers on the output side are those which are indicated with reference numerals 820-1 through 820-n. On the other hand, assuming that the combination circuit is the circuit 811-1, the scan-path registers on the input side are those which would be denoted with suitable reference numerals, not shown though, while the scan-path registers on the output side are those which are indicated with reference numerals 810-1 through 810-n. Similarly, assuming that the combination circuit is the circuit 811-3, the scan-path registers on the input side are those which are indicated with reference numerals 820-1 through 820-n while the scan-path registers on the output side are those which to be are indicated with suitable reference numerals not shown, too.

(3) Test Serial Output Operation

In this operation, the resultant output SOUT of the combination circuit, which is stored in the scan-path registers on the output side of the combination circuit, is serially outputted from the data output terminal 881 for the scan-path with the help of the shift operation. This operation is executed in response to the second clock signal CL2.

(4) Comparison Operation Using Expected Value

In this operation, there is made a comparison between an expected value and the data outputted from the data output terminal 881 for the Scan-path. In this case, the expected value is defined as a data that has to be outputted from a combination circuit when it normally operates. For instance, the expected value is the data that has to be outputted from the normally operating combination circuit 811-2 when the test vector SIN stored in the scan-path registers 810-1 through 810-n is inputted to the combination circuit 811-2. That is, if the output data SOUT outputted from the data output terminal 881 for the scan-path coincides with the expected value, it can be determined that the combination circuit 811-2 is normal. Contrary to this, if the output data SOUT outputted from the data output terminal 881 for the scan-path does not coincide with the expected value, it can be determined that the combination circuit 811-2 is not normal.

However, in case of executing the logical verification of the semiconductor integrated circuit by means of the scan-path register as described above, all or the greater part of the registers in the semiconductor integrated circuit have to be replaced by the scan-path registers, and also, these scan-path registers have to be connected with each other in a shift register fashion. Needless to say, this results in the unnecessary enlargement in the scale of the semiconductor integrated circuit. Thus, this becomes a problem to be solved.

Further, in the semiconductor integrated circuit, a plurality of registers are often put together in a group, which is handled as a register group. In this case, in order to make the scale of the semiconductor integrated circuit as smaller as possible, there is a tendency for the register group to be constituted so as to have a structure similar to that of the memory. Therefore, each register forming the register group can not be connected with each other in a shift register fashion. As a result, it becomes possible neither to execute the test serial input operation nor to carry out the test serial output operation, as far as both require the shift operation. Thus, this presents another problem to be solved.

Still further, in the prior art method, in order to execute the shift operation, a large number of registers have to be connected in a shift register fashion such that the timing lag of the clock signal (referred to as "clock skew" hereinafter) in each register is exactly matched with each other. For this, the addition of a delay element such as a buffer has to be considered for matching the clock skews with each other when designing the circuit and the pattern. This addition of the delay element naturally results not only in the undesirable enlargement in the scale of the semiconductor integrated circuit but also in the increase of power consumption thereof. Thus, this causes still another problem to be solved.

Accordingly, the invention has been made in view of the problems as described above, and one object of the invention is to provide a novel and improved semiconductor integrated circuit which can possibly minimize the scale of the circuit.

Further, the other object of the invention is to provide a novel and improved semiconductor integrated circuit, of which the power consumption can be reduced as smaller as possible.

SUMMARY OF THE INVENTION

In order to solving the problems as described, according to the invention, there is provided a semiconductor integrated circuit having the function of logically verifying the internal circuit thereof, which includes a plurality of units to be logically verified, of which each independently operates in the ordinary operation and includes data maintain circuits which are operable as a shift register when connected in sequence with each other in the logical verification operation; an input portion to which the instruction of logical verification is externally inputted; an instruction register portion in which the instruction of logical verification is stored; an instruction decoder circuit which decodes the instruction stored in the instruction register portion and executes the instruction of the logical verification against the units; and an output portion for externally outputting the processing result of the units.

According to the semiconductor integrated circuit as constituted above, the instruction of the logical verification can be directly inputted to the instruction register through the external terminal i.e. the above input portion, and further each unit is provided with a scan-path register i.e. a data maintain circuit, so that the scale of the semiconductor integrated circuit can be reduced to a great extent and the logical verification can be executed thereby.

Further, in the semiconductor integrated circuit as constituted above, the above output portion may include a data bus which is commonly connected with the plurality of units, respectively, and a common register portion which stores the data outputted to the data bus from the plurality of units.

Accordingly, as mentioned above, the above output portion may include the common data bus connecting with each of the plurality of units and one common register connected with the data bus, and further the instruction of the logical verification can be directly inputted to the instruction register through the external terminal i.e. the above input portion, so that the scale of the semiconductor integrated circuit can be reduced to a great extent and the logical verification can be executed thereby.

Still further, the above output portion may include a parallel output portion which outputs in parallel the data stored in the common register portion. With this, the data stored in the common register portion can be directly observed through the common register output terminal, thereby the logical verification time being considerably shortened.

Still further, the above input portion may include a parallel input portion which inputs in parallel the instruction of the logical verification to the instruction register portion. Accordingly, the instruction to be stored in the instruction register can be inputted in parallel thereto through the instruction register input terminal. With this, the logical verification time can be fairly shortened.

Still further, the above input portion may include a common register input terminal for inputting the data to the common register portion, and the above output portion may include an instruction register output terminal for outputting the instruction of the instruction register portion.

Accordingly, in the above semiconductor integrated circuit, it is made possible to directly input the instruction to the instruction register portion through the external terminal and the common data bus is connected with the common register portion. Therefore, if there are additionally provided, without changing the basic constitution of the semiconductor integrated circuit, a common register scan input terminal, a common register scan output terminal, an instruction register scan input terminal, and an instruction register scan output terminal, it becomes possible for the semiconductor integrated circuit to have the function of emulation which enables the observation of the internal register or the setting of the data to the internal register, during the operation of the semiconductor integrated circuit. Still further, the common register portion can be used as an general auxiliary register in the ordinary operation, so that it can be effectively used in the ordinary operation and in the emulating operation as well.

Preferably, the common register portion includes a common register which is used in the ordinary operation and a common back register which is used in the emulating operation. With this, the common register can be used exclusively in the ordinary operation while the common back register can be exclusively used in the emulating operation. This can also shorten the time needed for emulation.

Preferably, the instruction register portion may include an instruction register which is used in the ordinary operation and an instruction back register which is used in the emulating operation. With this, the instruction register can be used exclusively in the ordinary operation while the instruction back register can be exclusively used in the emulating operation. This can also shorten the time needed for emulation. Further, even in case of processing the data of the internal register which might be changed or destroyed through the emulating operation, the time of the emulating operation can be shortened by adopting the same construction as the above.

BRIEF DESCRIPTION OF THE DRAWINGS

The above and other objects, features and advantages of the invention will become apparent from reading through the following description and the appended claims, with reference to the accompanying drawings, in which:

DETAILED DESCRIPTION OF THE PREFERRED EMBODIMENTS

Figure 1:
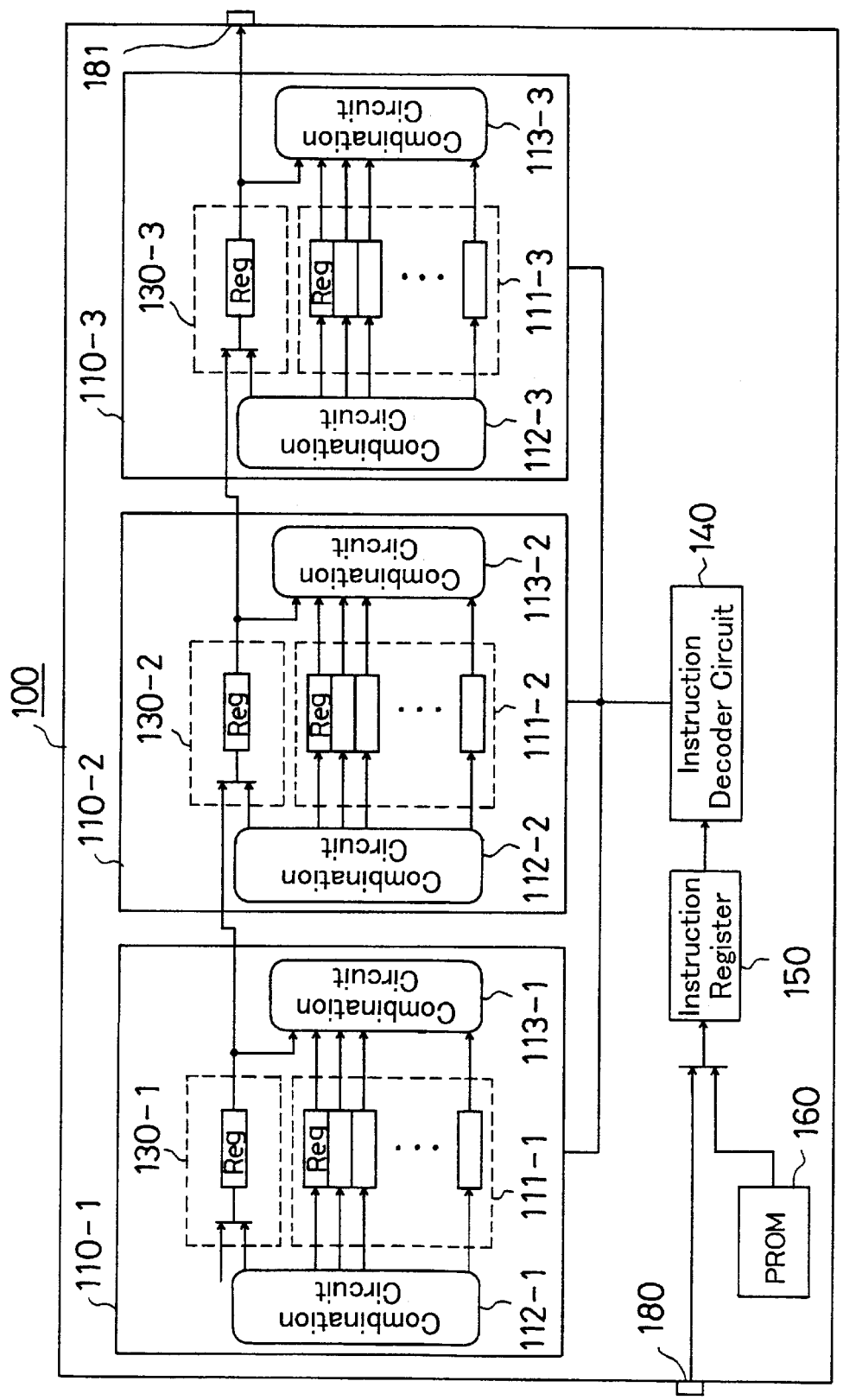
FIG. 1 is a circuit diagram for explaining the constitution of a semiconductor integrated circuit according to the first embodiment of the invention.

The invention will now be described in detail with regard to various preferred embodiments according to the invention with reference to the accompanying drawings. In this specification and the drawings, the constituents of preferred embodiments having the substantially like function and constitution are denoted by like reference numerals and characters in order to avoid the repetitive explanation thereof.

(First Embodiment)

At first, the constitution of a semiconductor integrated circuit 100 according to the first embodiment of the invention will be explained with reference to FIG. 1. The semiconductor integrated circuit 100 includes a plurality of units 110-1, 110-2, and 110-3 as shown in the FIG. 1. These units 110-1, 110-2, and 110-3 are units which carry out a predetermined operation respectively assigned thereto. They may be a data operation unit, an address operation unit, a program operation unit and so forth, for instance. The number of the units may be increased or decreased according to the circuit to which they are adapted.

The unit 110-1 is principally constructed including combination circuits 112-1 and 113-1 which are the units to be logically verified, a scan-path register 130-1, and a register group 111-1. The units 110-2 and 110-3 have the same structure as the unit 110-1, so that the explanation thereof will be omitted in the following.

Figure 2:
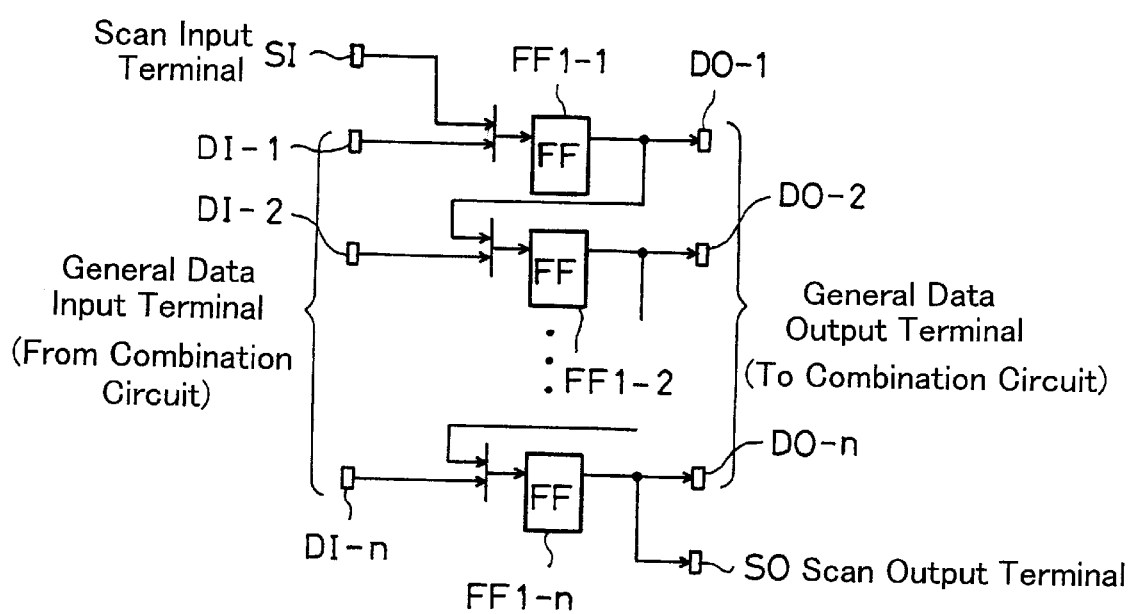
FIG. 2 is a circuit diagram for explaining the circuit constitution of a scan-path register.

The circuit of the scan-path register 130-1 includes, as shown in FIG. 2, general input terminals DI-i (i=1,2, ..., n) of n which receive the data from the combination circuit 112-1 and perform the input/output operation of the data during the normal operation, flip-flop circuits FF1-i (i=1,2, ..., n) of n, general data output terminal DO-i (i=1,2, ..., n) of n, and a scan input terminal SI and a scan output terminal SO which perform the shift operation in the logical verification time. This shift operation in the logical verification will be explained later.

In the ordinary operation of the scan-path register 130-1, the data inputted from the combination circuit 112-1 is inputted to the internal portion of the scan-path register 130-1 through the general data input terminal DI-i (i=1,2,..., n), and is outputted from the general data output terminal DO-i to the external portion of the scan-path register 130-1 through the flip-flop circuit FF1-i.

In the shift operation of the scan-path register 130-1 which is carried out in the logical verification time, the data inputted from the scan-path input terminal SI is outputted from the scan-path output terminal SO sequentially through flip-flop circuits FF1-1, FF1-2, ..., FF1-n.

Figure 3:
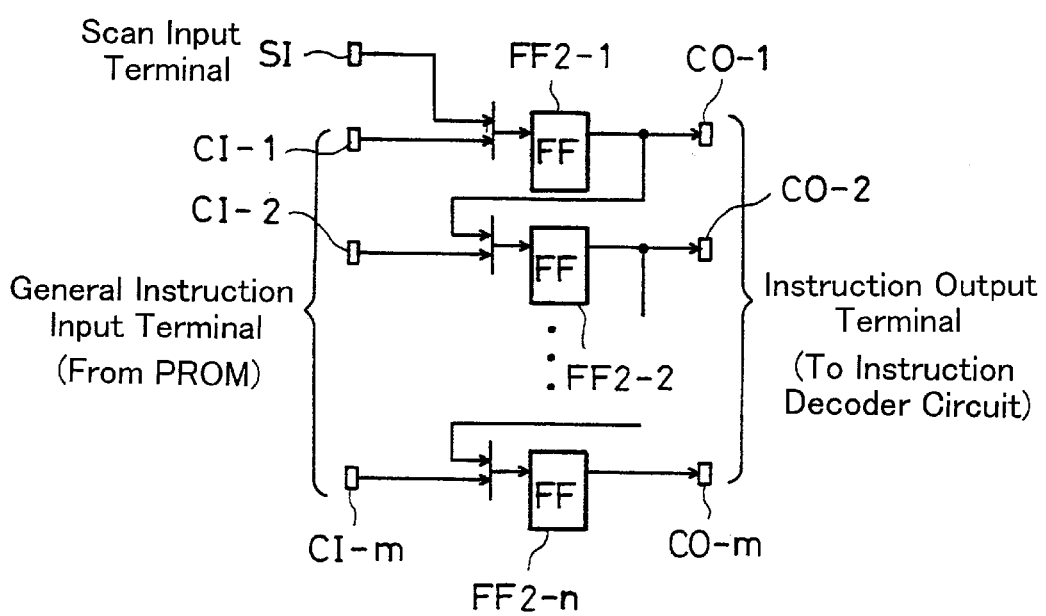
FIG. 3 is a circuit diagram for explaining the circuit constitution of an instruction register.

The circuit of an instruction register 150 is constructed, as shown in FIG. 3, including general instruction input terminals CI-i (i=1,2, ..., m) of m which receive the instruction from a programmable read only memory (PROM) 160 and operate to input/output the instruction in the ordinary operation, flip-flop circuits FF2-i (i=1,2, ..., m) of m, general instruction output terminals CO-i (i=1,2, ..., m) of m, and a scan-path terminal SI for the shift operation in the logical verification time. The scan output for the shift operation in the logical verification time is executed with the help of the general instruction output terminals CO-m.

In the ordinary operation of the instruction register 150, the instruction inputted from the PROM 160 is inputted to internal portion of the instruction register 150 through the general instruction input terminal CI-i (i=1,2, ..., m) and is outputted from the general instruction output terminal CO-i to the external portion of the instruction register 150 through the flip-flop circuits FF2-i.

In the shift operation of the instruction register 150 in the logical verification time, the instruction inputted from the scan-path input terminal SI is outputted in sequence from the general instruction output terminal CO-m through the flip-flop circuits FF2-1, FF2-2, ..., FF2-m.

The scan-path register 130-1 in itself is a register which is to be arranged as one of the register group 111-1, but it is arranged so as to serve as the scan-path register 130-1 herein. This can be applied in the same way to the other scan-path registers 130-2 and 130-3.

Now, it will be described in the following how to execute the logical verification over the semiconductor integrated circuit 100 as constructed above.

In order to logically verify the operation of the internal circuit of the objective circuit, the instruction regarding a proper operation is inputted in sequence to the instruction register 150 through an instruction register scan input terminal 180 and is stored therein. For instance, in case of verifying the operation of the unit 110, after the operation of the unit 110-1 is over, there is inputted to the instruction register 150 through the input terminal 180, the instruction that the result of the operation by the unit 110-1 be stored in the scan-path register 130-1. Similarly, in case of verifying the data stored in the register group 111-1, there is inputted to the instruction register 150 through the input terminal 180, the instruction that the data stored in the register group 111-1 be transferred to the scan-path register 130-1.

Then, the instruction stored in the instruction register 150 is given to and decoded by an instruction decoder circuit 140, and the decoded instructions are given as operational orders to the units 110-1, 110-2, and 110-3, respectively.

If the operation instruction as described above is not completed by a single instruction, a plurality of operation instructions are sequentially inputted to the instruction register 150, based on which each unit executes the designated operations, for instance the data transfer operation and so forth according to the instructions.

The data stored in each of scan-path registers 130-1, 130-2, and 130-3 according to the operation instruction as described above, is outputted in sequence from the unit scan output terminal 181, thereby the operation of the circuit being verified.

As described above, according to the first embodiment of the invention, there is provided a circuit which makes it possible to directly input the instruction to the instruction register 150 through the external terminal. Further, the scan-path registers 130-1, 130-2, and 130-3 are provided corresponding to the units 110-1, 110-2, and 110-3, respectively, thus enabling the logical verification to be executed. Therefore, the circuit scale can be reduced to a great extent.

Furthermore, the number of registers connected in a shift register fashion is reduced to a great extent, so that it is less needed to use the delay element such as a buffer for matching the clock skews with each other. Consequently, the increase rate of the circuit scale and the power consumption which is caused by addition of the delay element, can be greatly reduced comparing to the prior art method.

(Second Embodiment)

Figure 4:
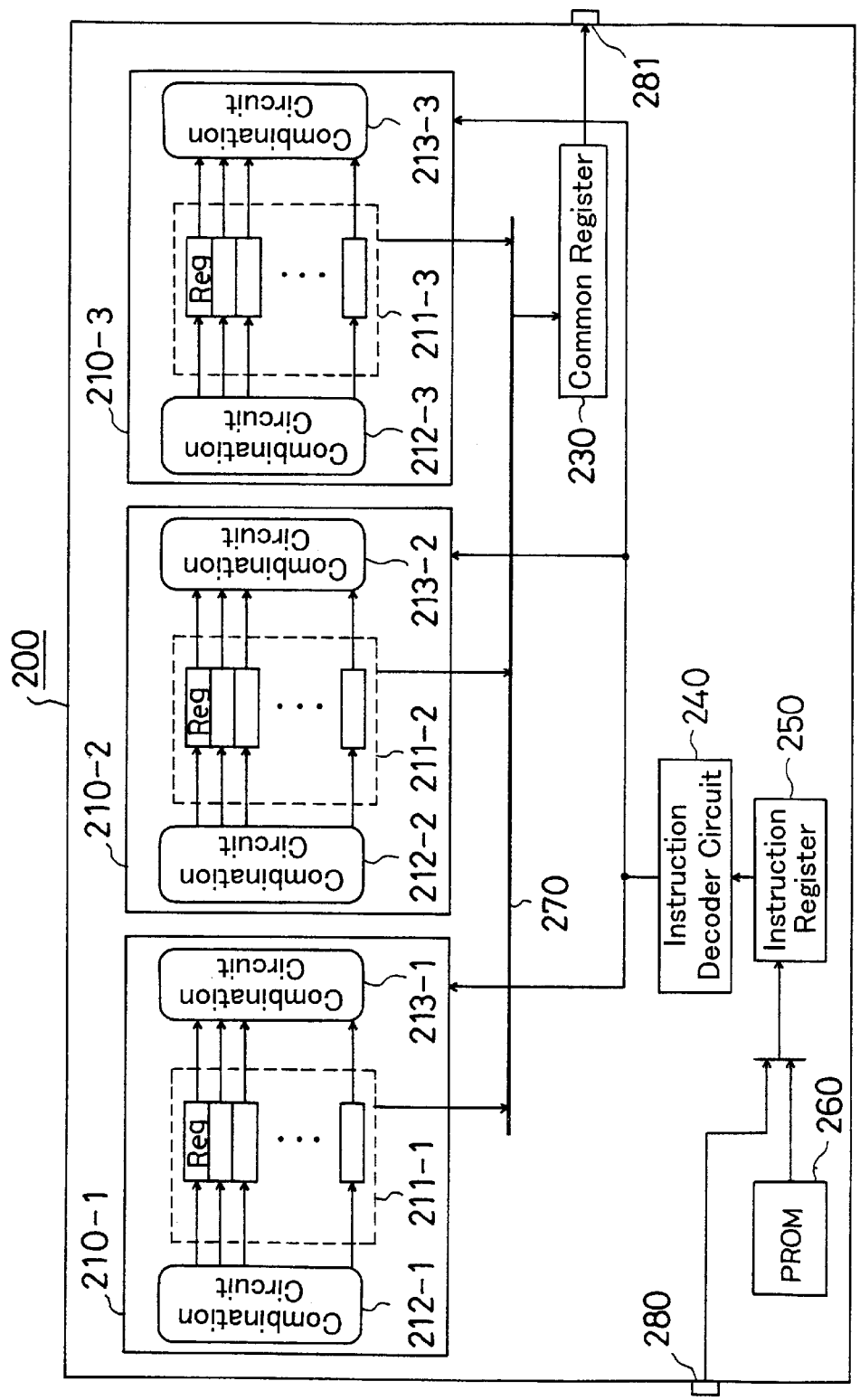
FIG. 4 is a circuit diagram for explaining the constitution of a semiconductor integrated circuit according to the second embodiment of the invention.

Referring to FIG. 4, there is shown a circuit diagram of another semiconductor integrated circuit 200 according to the second embodiment of the invention. As will be seen from the figure, the semiconductor integrated circuit 200 is provided with units 210-1, 210-2, and 210-3, similar to the semiconductor integrated circuit 100 according to the first embodiment as described above. In the semiconductor integrated circuit 100 as described above, each unit is provided with the scan-path register. In the semiconductor integrated circuit 200, however, there is provided a common register 230 which functions as the scan-path register for all the units, instead of individually providing one scan-path register per unit. Further, there is provided a data bus 270 which exchanges the data between each unit and the common register 230.

The common register 230 has the function of executing the parallel input operation, so that the units 210-1, 210-2 and 210-3 can output the data in parallel to the common register 230 through the data bus 270. On one hand, the common register 230 also has the function of executing the serial output operation, so that it can serially output the data which is inputted in parallel from the units 210-1, 210-2 and 210-3, to a common register scan output terminal 281.

As described above, according to the semiconductor integrated circuit 200 of the second embodiment, it is no longer needed that each of units 210-1, 210-2 and 210-3 internally includes the individual scan-path register, and the same logical verification as executed by the semiconductor integrated circuit 100 of the first embodiment can be carried out by outputting the data to the common register 230 through the data bus 270. Accordingly, the logical verification can be executed even though the number of units is so large or each unit can not individually include the scan-path register, and the circuit scale can be further reduced to a great extent.

Furthermore, it would be possible to add the simple modification, for instance just adding the common register 230 and the data bus 270, to the circuit design of the existing semiconductor integrated circuit without changing its basic unit. Therefore, according to the invention, it is possible to easily provide the existing semiconductor integrate circuit with the function of logical verification.

(Third Embodiment)

Figure 5:
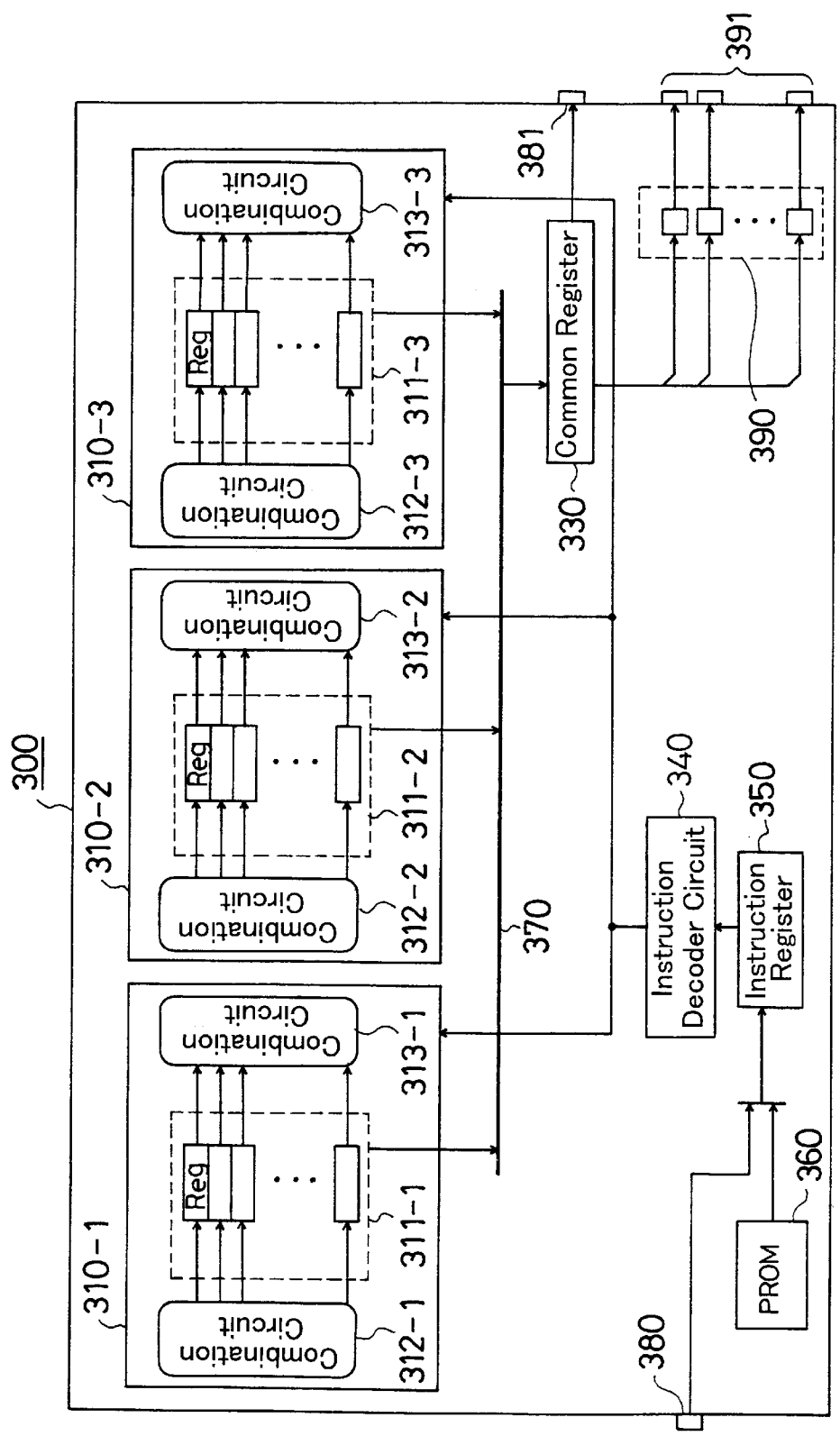
FIG. 5 is a circuit diagram for explaining the constitution of a semiconductor integrated circuit according to the third embodiment of the invention.

Referring to FIG. 5, there is illustrated a circuit diagram of still another semiconductor integrated circuit 300 according to the third embodiment of the invention. The semiconductor integrate circuit 300 is the circuit attained by improving the semiconductor integrated circuit 200 of the above second embodiment. As shown in the figure, the semiconductor integrated circuit 300 also includes a common register 330 in the same way as the semiconductor integrated circuit 200. In the semiconductor integrated circuit 200, the common register 230 outputs the data in sequence to the common register scan output terminal. In the semiconductor integrated circuit 300, however, the common register 330 is made up so as to output the data directly to common register scan output terminal, not only in sequence but also in parallel. For this, especially for realizing the parallel output of the data, the semiconductor integrated circuit 300 includes a plurality of common register output terminals 391 and common register output pads 390.

However, it is true that there is a semiconductor integrated circuit such as a DSP, which does not allow the number of terminals on a chip to be increased. In such case, the common register output terminal 391 may be designed such that it is commonly used with the other available chip terminal of which function can be switched by a selector. Further, there would be a case where the common register output terminal 391 can not be allowed due to the limitation over the number of chip terminals. In this case, the logical verification of the semiconductor integrated circuit still in the form of a wafer i.e. before being fabricated in a chip form, can be executed by using the common register output pad 390. More specifically, the data stored in the common register 330 can be directly observed through the common register output pad 390. This comes to shorten the logical verification time as a whole. However, after fabricating the circuit in the form of a chip, the logical verification is performed by using the common register scan output terminal 381.

In case of executing the logical verification in the semiconductor integrated circuit 200 according to the second embodiment, the data stored in the common register 230 has to be outputted in sequence on the bit by bit basis through the common register scan output terminal 281. For this, in order to observe the data stored in the common register 230, it is required to supply the clock having the bit width of the common register 230, thus the logical verification taking a longer time. In contrast, with the semiconductor integrated circuit 300 according to the third embodiment, as the data stored in the common register 330 can be directly observed by means of the common register output terminal 391, so that the time needed for the logical verification can be shortened.

(Fourth Embodiment)

Figure 6:
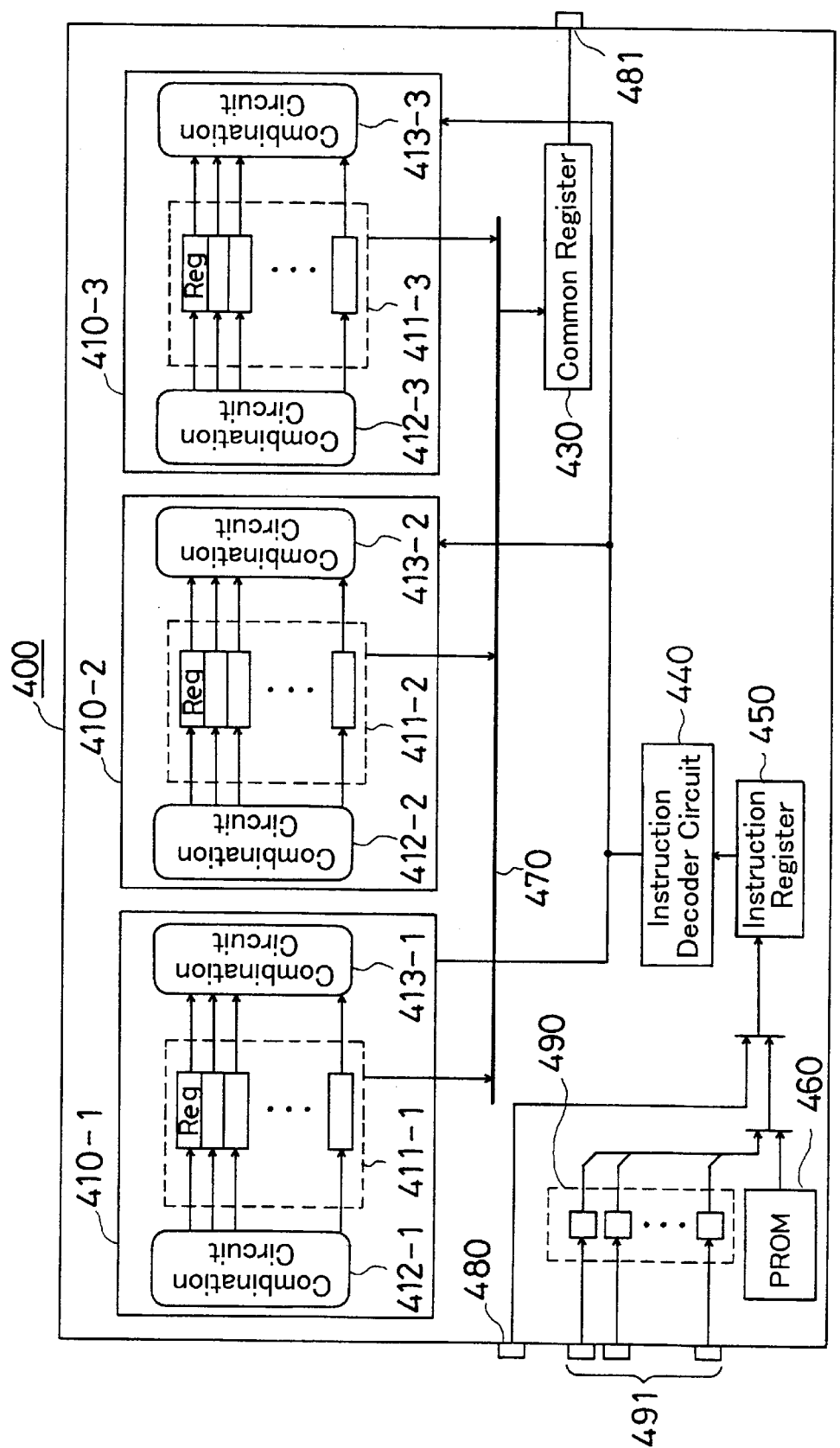
FIG. 6 is a circuit diagram for explaining the constitution of a semiconductor integrated circuit according to the fourth embodiment of the invention.

Referring to FIG. 6, there is illustrated a circuit diagram of still another semiconductor integrated circuit 400 according to the fourth embodiment of the invention. The semiconductor integrate circuit 400 is the circuit achieved by improving the semiconductor integrated circuit 200 according to the second embodiment. As shown in the figure, similar to the semiconductor integrated circuit 200, the semiconductor integrated circuit 400 includes an instruction register 450 and an instruction decoder circuit 440. In the semiconductor integrated circuit 200, the instruction register 240 receives the instruction from the instruction register scan input terminal 280. In the semiconductor integrated circuit 400, however, the instruction register 450 is made up such that it not only receives the instruction in sequence from a common register scan input terminal 480, but also receives directly and in parallel from a plurality of instruction register input terminals 491 and instruction register input pads 490.

However, it is true that there is a semiconductor integrated circuit such as a DSP, which does not allow the number of terminals on a chip to be increased. In such case, the instruction register input terminal 491 may be designed such that it is commonly used with the other available chip terminal of which function can be switched by a selector. Further, there would be a case where the instruction register input terminal 491 can not be provided due to the limitation over the number of chip terminals. In this case, the logical verification of the semiconductor integrated circuit still in the form of a wafer i.e. before being fabricated in a chip form, can be executed by using the instruction register input pad 490. More specifically, the instruction can be directly inputted to the instruction register 450 through the instruction register input pad 490. This comes to shorten the logical verification time as a whole. However, after fabricating the circuit in the form of a chip, the logical verification is performed by using the instruction register scan input terminal 480.

In case of executing the logical verification in the semiconductor integrated circuit 200 according to the second embodiment, the input of the instruction to the instruction register 250 has to be carried out in sequence on the bit by bit basis through the instruction register scan input terminal 280. For this, in order to store the instruction in the instruction register 250, it is required to supply the clock having the bit width of the instruction register 250, thus the logical verification taking a longer time. In contrast, according to the semiconductor integrated circuit 400 of the fourth embodiment, the instruction to be stored in the instruction register 450 can be directly input in parallel by means of the instruction register input terminal 491, so that the logical verification time can be shortened.

(Fifth Embodiment)

In general, when the chip fabrication is completed, a predetermined program is actually run with this chip, and after a predetermined period of time has passed, the internal register of the semiconductor integrated circuit is observed, or the data for logical verification is set to the internal register, thereby logically verifying the operation thereof. This procedure is referred to as "emulation" in the following. The semiconductor integrated circuit 500 according to the fifth embodiment is the circuit obtained by improving the semiconductor integrated circuit 200 according to the second embodiment as described above, and is constructed such that it can execute the emulating operation.

Figure 7:
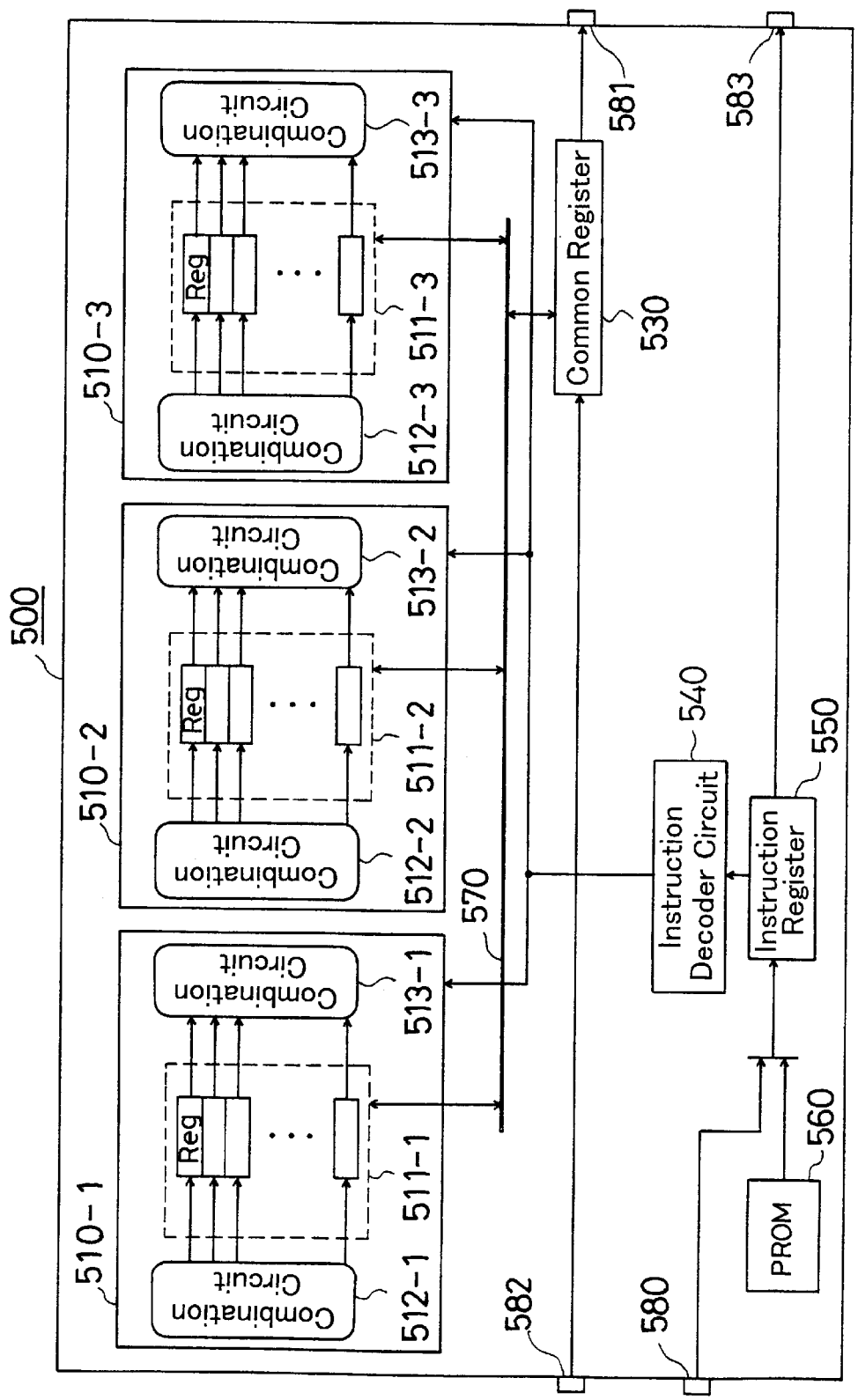
FIG. 7 is a circuit diagram for explaining the constitution of a semiconductor integrated circuit according to the fifth embodiment of the invention.

Now, referring to FIG. 7, there is indicated a circuit diagram of still another semiconductor integrated circuit 500 according to the fifth embodiment. In the semiconductor integrated circuit 500, as will be seen from the figure, in addition to the structure of the semiconductor integrated circuit 200, there are provided a common register scan input terminal 582 which directly inputs the data to a common register 530, and an instruction register scan output terminal 583 which directly outputs the instruction from the instruction register 550.

The emulating operation in the semiconductor integrated circuit 500 as constructed above will now be described in the following.

(1) In case of actually executing the instruction which is stored in the PROM 560 for instance, and observing the internal register or setting the data to the internal register, the operation of the circuit is stopped for a time.

(2) After stopping the circuit operation, the instruction stored in the instruction register 550 is outputted through the instruction register scan output terminal 583 and stored in an external storage means (not shown).

(3) If the common register 530 is used in the ordinary operation, the data stored in the common register 530 is outputted through the common register scan output terminal 581 and is stored in the external storage means (not shown).

Further, if there is a possibility that the data of the internal register might be changed due to execution of the emulating operation, such data has to be outputted from the internal register through the common register 530 and stored by means of the external storage means such as a scan chain (not shown).

(4) In case of observing the internal register, the data transfer instruction for transferring the data from the objective register to the common register 530 is inputted to the instruction register 550 through the instruction register scan input terminal 580. With this instruction, there is executed the data transfer from the objective register to the common register 530. After this data transfer operation, the data stored in the common register 530 is outputted through the common register scan output terminal 581. In case of the data setting to the internal register, the data is inputted to the common register 530 through the common register scan input terminal 582. After this, the data transfer instruction for transferring the data from the common register 530 to the objective register to be set with the data, is inputted to the instruction register 550 through the instruction register scan input terminal 580. With this instruction, there is performed the data transfer from the common register 530 to the objective register to be set with the data.

(5) If the common register 530 is used in the ordinary operation, the data of the common register 530, which is stored in the above step (3), is inputted to the common register 530 through the common register scan input terminal 582, thereby returning to the state (1). Also, the data of the internal register which might be changed through the emulating operation, is similarly returned to the state (1) by resetting the circuit.

(6) The instruction of the instruction register 550 which is stored in the external storage means (not shown), is inputted to the instruction register 550 through the instruction register scan input terminal 580, thereby returning to the state (1).

(7) The semiconductor integrated circuit is then run again from the instruction next to the instruction that stopped the circuit for a time in the step (1).

As described in the above, the semiconductor integrated circuit 500 according to the fifth embodiment can include, without changing its basic circuit structure, the circuit enabling the instruction register 550 to directly receive the instruction from the external terminal, the common register 530 which is common to the data bus 570, the common register scan input terminal 582, the common register scan output terminal 581, the instruction register scan input terminal 580, and the instruction register scan output terminal 583. With this, the semiconductor integrated circuit 500 comes to have the emulation function, which enables the observation of the internal register and the data setting to the internal register to be carried out even in its operation. Further, the common register 530 can be used as an auxiliary register in the ordinary operation, so that it can be effectively used in the ordinary operation and in the emulating operation as well.

(Sixth Embodiment)

Figure 8:
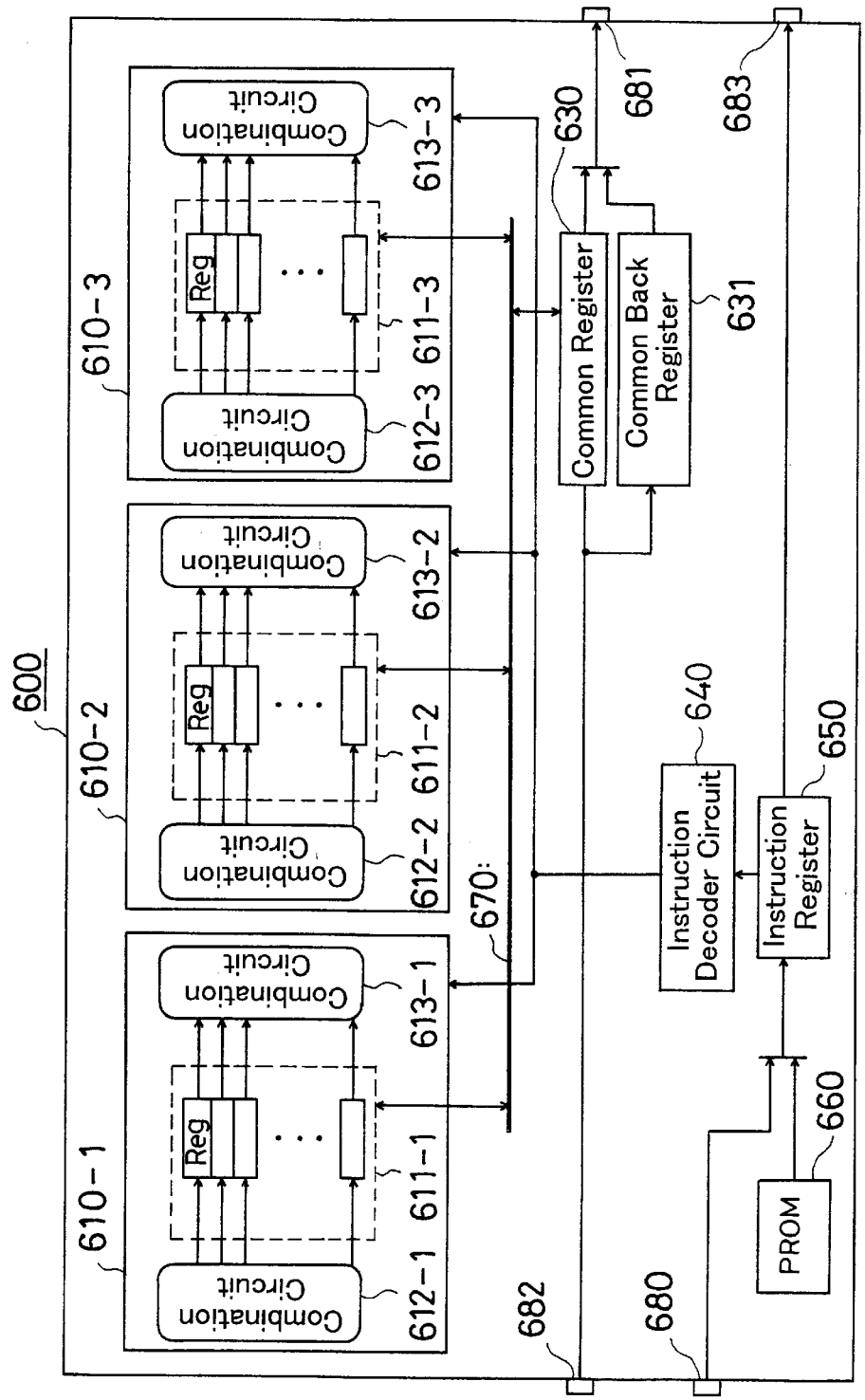
FIG. 8 is a circuit diagram for explaining the constitution of a semiconductor integrated circuit according to the sixth embodiment of the invention.

Referring to FIG. 8, there is shown a circuit diagram of still another semiconductor integrated circuit 600 according to the sixth embodiment of the invention. The semiconductor integrated circuit 600 is the circuit achieved by improving the semiconductor integrated circuit 500 according to the fifth embodiment. In the semiconductor integrated circuit 500, the identical common register is used regardless of a sort of the operation i.e. in the ordinary operation and in the emulating operation as well. As will be seen from the figure, in the semiconductor integrated circuit 600, there is provided in addition to the structure of the semiconductor integrated circuit 500, another register 631 which is exclusively used for the emulating operation (referred to as "common back register" herein after).

In the following, there will be described the operation of the semiconductor integrated circuit 600 as constructed above. In the semiconductor integrated circuit 500 according to the fifth embodiment, in order to observe the internal register or set the data to the internal register, it is needed to take the following steps: that is, first outputting the data of the common register 530 through the common register scan output terminal 581 to store it in the external storage means, and upon completion of the observation of the internal register or the data setting to the internal register, and returning the data stored in the external storage means to the common register 530 through the common register scan input terminal 582. Moreover, the scan input/output of the data to the common register 530 is executed in a serial transfer mode, so that it is required for the clock to have the bit width of the common register 530 upon the input/output of the data. However, the semiconductor integrated circuit 600 according to the sixth embodiment is constructed such that the common register 630 is used in the ordinary operation while the common back register 631 is used in the emulating operation.

As described above, with addition of the common back register 631 in correspondence to the common register 630, the former can be used only in the emulating operation while the latter can be used just in the ordinary operation. Consequently, both the data storing operation and the data resetting operation can be eliminated from the emulating operation, so that the time needed for the emulating operation can be shortened.

Furthermore, in the semiconductor integrated circuit 600 as shown in FIG. 8, the scan chain is separately prepared for each of the common register and the instruction register. However, such respective scan chains may be made up into a single one. If made up so, the number of terminals on the chip can be reduced.

(Seventh Embodiment)

Figure 9:
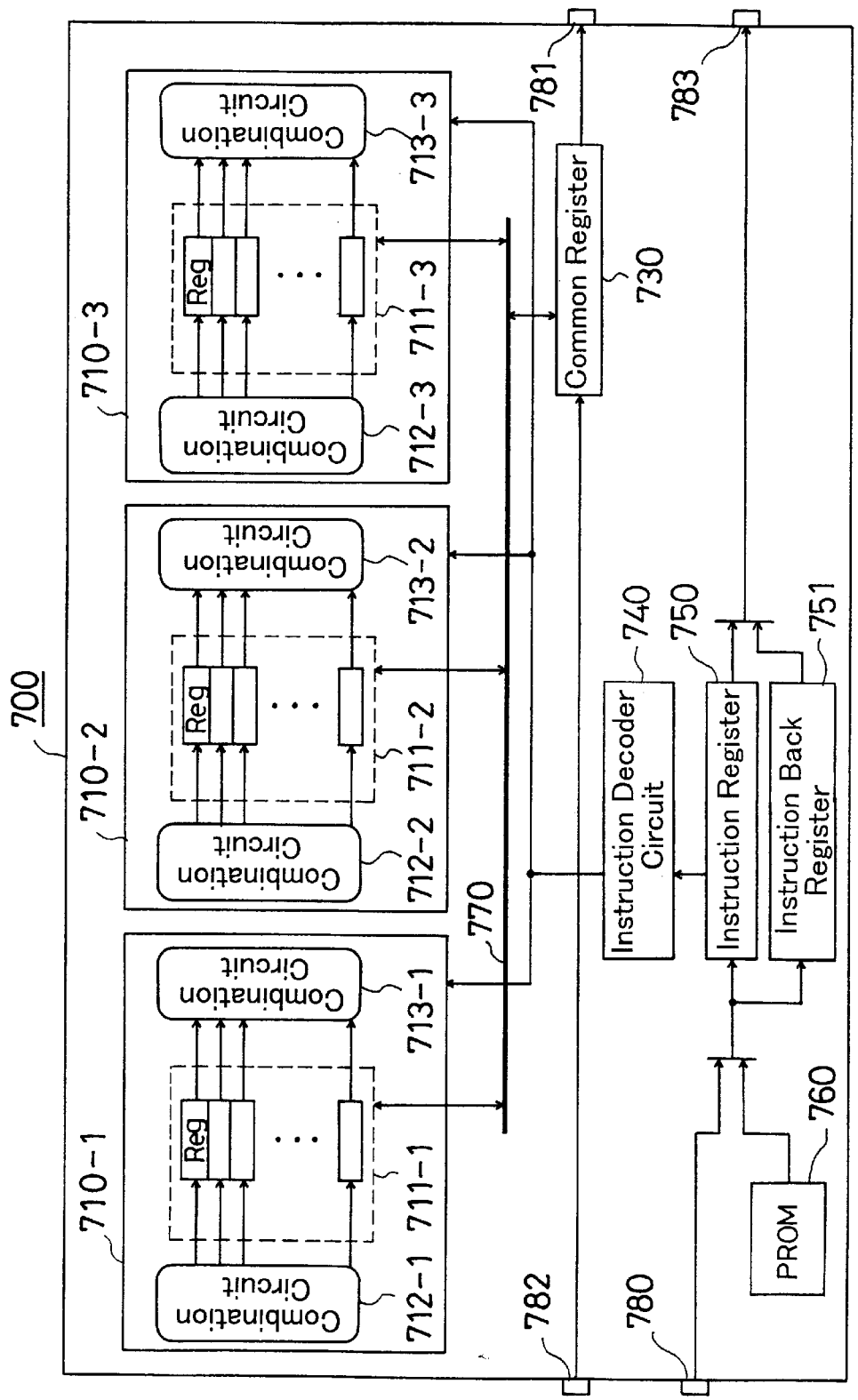
FIG. 9 is a circuit diagram for explaining the constitution of a semiconductor integrated circuit according to the seventh embodiment of the invention.
Figure 10:
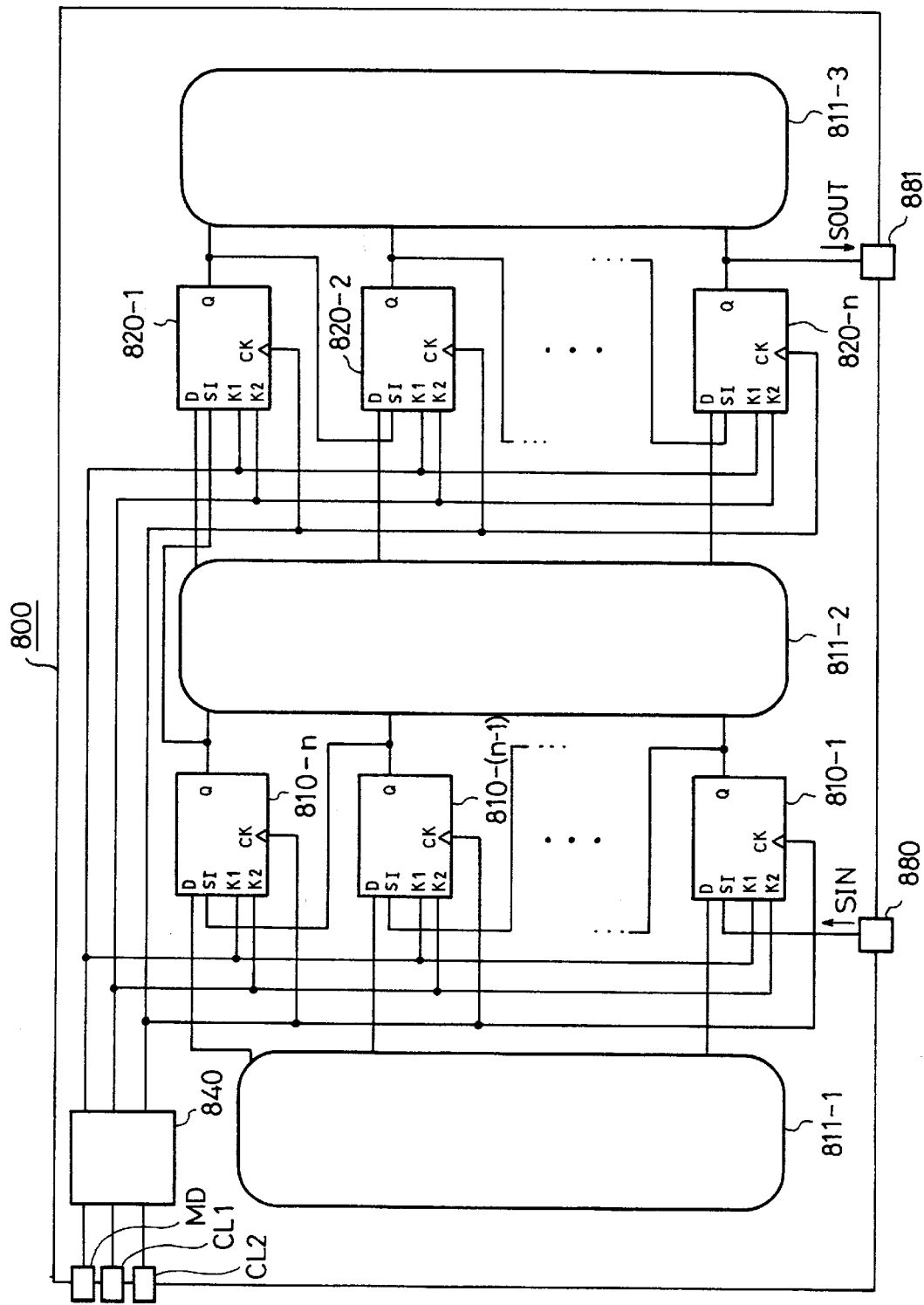
FIG. 10 is a circuit diagram for explaining the constitution of a prior art semiconductor integrated circuit.

Referring to FIG. 9, there is illustrated a circuit diagram of still another semiconductor integrated circuit 700 according to the seventh embodiment of the invention. The semiconductor integrated circuit 700 is the circuit attained by improving the semiconductor integrated circuit 500 of the fifth embodiment. In the semiconductor integrated circuit 500, the identical instruction register is used regardless of a sort of the operation i.e. in the ordinary operation and in the emulating operation as well. As will be seen from the figure, in the semiconductor integrated circuit 700, there is provided in addition to the structure of the semiconductor integrated circuit 500, another register 751 which is exclusively used for the emulating operation (referred to as "instruction back register" herein after).

In the following, there will be described the operation of the semiconductor integrated circuit 700 as constructed above. In the semiconductor integrated circuit 500 according to the fifth embodiment, in order to observe the internal register or set the data to the internal register, it is needed to take the following steps: that is, first outputting the instruction of the instruction register 550 through the instruction register scan output terminal 583 to store it in the external storage means (not shown), and after completion of the observation of the internal register or the data setting to the internal register, returning the instruction stored in the external storage means to the instruction register 550 through the instruction register scan input terminal 580. Moreover, the scan input/output of the data to the instruction register 550 is executed in a serial transfer mode, so that it is required for the clock to have the bit width of the instruction register 550 upon the input/output of the data.

However, the semiconductor integrated circuit 700 according to the seventh embodiment is constructed such that the instruction register 750 is used in the ordinary operation while the instruction back register 751 is used in the emulating operation.

As described above, with addition of the common back register 751 in correspondence to the instruction register 750, the former can be used only in the emulating operation while the latter can be used just in the ordinary operation. Consequently, both the data storing operation and the data resetting operation can be eliminated from the emulating operation, so that the time needed for the emulating operation can be shortened. Further, even in case of processing the data of the internal register which might be changed or destroyed by the emulating operation, the time needed for emulating operation can be shortened by adopting the same construction as the above.

The semiconductor integrated circuit according to the invention has been discussed in detail in the above by way of several preferred embodiments with reference to the accompanying drawings. However, it should be understood that the invention is not limited by those embodiments. It will be apparent that any one skilled in the art can make various changes and modifications to the invention without departing from the technical thoughts as set forth herein as well as recited in the appended claims for patent.

The entire disclosure of Japanese Patent Application No. 10-197822 filed on Jul. 13, 1998 including specification, claims, drawings and summary is incorporated herein by reference in its entirety.

What is claimed is:

1. A semiconductor integrated circuit having a function of logically verifying an internal circuit thereof, comprising:

a plurality of circuit units which are selectively operable in either one of an ordinary operation mode or a logical verification mode, and which operate independently during the ordinary operation mode, wherein each of said circuit units comprises (a) first and second combination circuits to be logically verified during the logical verification mode, (b) a register group which is operable in the ordinary operation mode and the logical verification mode to transfer data internally of the circuit unit between the first and second combination circuits, and (c) a scan-path register, wherein the scan-path register of each circuit unit is switchable between the ordinary operation mode and the logical verification mode, wherein the scan-path register of each circuit unit is operable in the ordinary operation mode to transfer data internally of the circuit unit between the first and second combination circuits, and wherein in the scan-path register of each circuit unit is operable in the logical verification mode to transfer data externally of the circuit unit, and wherein the scan-path registers of the plurality of circuit units are connected together so as to function as a shift register during the logical verification mode;

an input portion which receives an externally input instruction for said logical verification mode;

an instruction register portion in which said instruction received by said input portion is stored;

an instruction decoder circuit which decodes the instruction stored in said instruction register portion and executes the logical verification mode with respect to each of said circuit units; and an output portion for externally outputting a processing result of the logical verification mode executed with respect to each of said circuit units.

2. A semiconductor integrated circuit as claimed in claim 1, wherein said input portion includes parallel inputs which input in parallel the instruction to said instruction register portion.

3. A semiconductor integrated circuit as claimed in claim 1, wherein each of the scan-path registers comprises:

a scan input terminal;

a plurality of data input terminals;

a scan output terminal;

a plurality of data output terminals; and a plurality of cascaded flip-flop circuits, wherein, in the ordinary operation mode, data is transferred in parallel from the data output terminals to the data input terminals via respective ones of the plurality of cascaded flip-flop circuits, and wherein, in the logical verification mode, data is transferred sequentially from the scan input terminal to the scan output terminal via the plurality of cascaded flip-flop circuits.

4. A semiconductor integrated circuit having a function of logically verifying an internal circuit thereof, comprising:

a plurality of circuit units which operate independently during an ordinary operation mode, wherein each of said circuit units comprises first and second combination circuits to be logically verified, and a register group which transfers data internally of the circuit unit between the first and second combination circuits;

an input portion which receives an externally input instruction for said logical verification mode;

an instruction register portion in which said instruction received by said input portion is stored;

an instruction decoder circuit which decodes the instruction stored in said instruction register portion and executes a logical verification mode with respect to each of said circuit units;

a data bus commonly connected to the register groups of the plurality of circuit units;

a common register having an input connected to the data bus and an output, wherein the common register is operable in the logical verification mode to transfer data externally of the circuit units; and an output portion connect to the output of the common register for externally outputting a processing result of the logical verification mode executed with respect to each of said circuit units.

5. A semiconductor integrated circuit as claimed in claim 4, wherein said output portion includes a parallel output terminals for outputting in parallel data stored in said common register.

6. A semiconductor integrated circuit as claimed in claim 4, wherein said input portion includes parallel inputs which input in parallel the instruction to said instruction register portion.

7. A semiconductor integrated circuit as claimed in claim 4, wherein said common register includes a common register portion which is used in an ordinary operation mode, and a common back register portion which is used in the logical verification mode.

8. A semiconductor integrated circuit as claimed in claim 4, wherein said instruction register portion is provided with an instruction register which is used in the ordinary operation mode, and an instruction back register which is used in the logical verification mode.

* * * * *